United States Patent
Sandstrom (12)

(10) Patent No.: US 6,975,443 B2
(45) Date of Patent: Dec. 13, 2005

(54) MULTI-BEAM PATTERN GENERATOR

(75) Inventor: Torbjorn Sandstrom, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 264 days.

(21) Appl. No.: 10/275,623

(22) PCT Filed: Jun. 25, 2001

(86) PCT No.: PCT/SE01/01443

§ 371 (c)(1),
(2), (4) Date: Nov. 7, 2002

(87) PCT Pub. No.: WO02/01298

PCT Pub. Date: Jan. 3, 2002

(65) Prior Publication Data

US 2003/0140806 A1    Jul. 31, 2003

(30) Foreign Application Priority Data

Jun. 27, 2000 (SE) .................................. 0002405

(51) Int. Cl.⁷ ............................................ G02B 26/00
(52) U.S. Cl. .................... 359/291; 359/10; 359/28; 359/210; 359/365; 359/813; 347/258; 430/311
(58) Field of Search ...................... 359/291, 10, 28, 359/210, 365, 813; 347/258; 430/311

(56) References Cited

U.S. PATENT DOCUMENTS

| 4,455,485 A |   | 6/1984 | Hosaka et al. ............. 250/234 |
| 4,504,726 A |   | 3/1985 | Hosaka et al. ......... 219/121.68 |
| 4,861,983 A | * | 8/1989 | Sasada et al. ............... 250/235 |
| 5,495,279 A |   | 2/1996 | Sandstrom ................. 347/258 |
| 6,570,840 B1 | * | 5/2003 | Wilkinson et al. ....... 369/275.4 |

\* cited by examiner

*Primary Examiner*—John A. McPherson
*Assistant Examiner*—Daborah Chacko-Davis
(74) *Attorney, Agent, or Firm*—Harness, Dickey & Pierce, P.L.C.

(57) ABSTRACT

A scanning pattern generator and a method for microlithographic multi-beam writing of high precision patterns on a photosensitive substrate (11), the system comprising a light source (1), preferably a laser, for generating at least two light beams, a computer-controlled light modulator (4), a deflector for scanning the beams on the substrate and an objective lens (10) to contract the at least one light beam from the light source before it reaches the substrate, wherein at least the objective lens is arranged on a carrier (22) being movable relative to the substrate (11) and the light source (1). Hereby, the carrier defines a movable optical path relative to the remaining, stationary optical path. Further, the system comprises means for altering the stationary optical path in order to maintain telecentricity for the beams as they impinge on the photosensitive substrate during the movement of the carrier and the movable optical path.

25 Claims, 3 Drawing Sheets

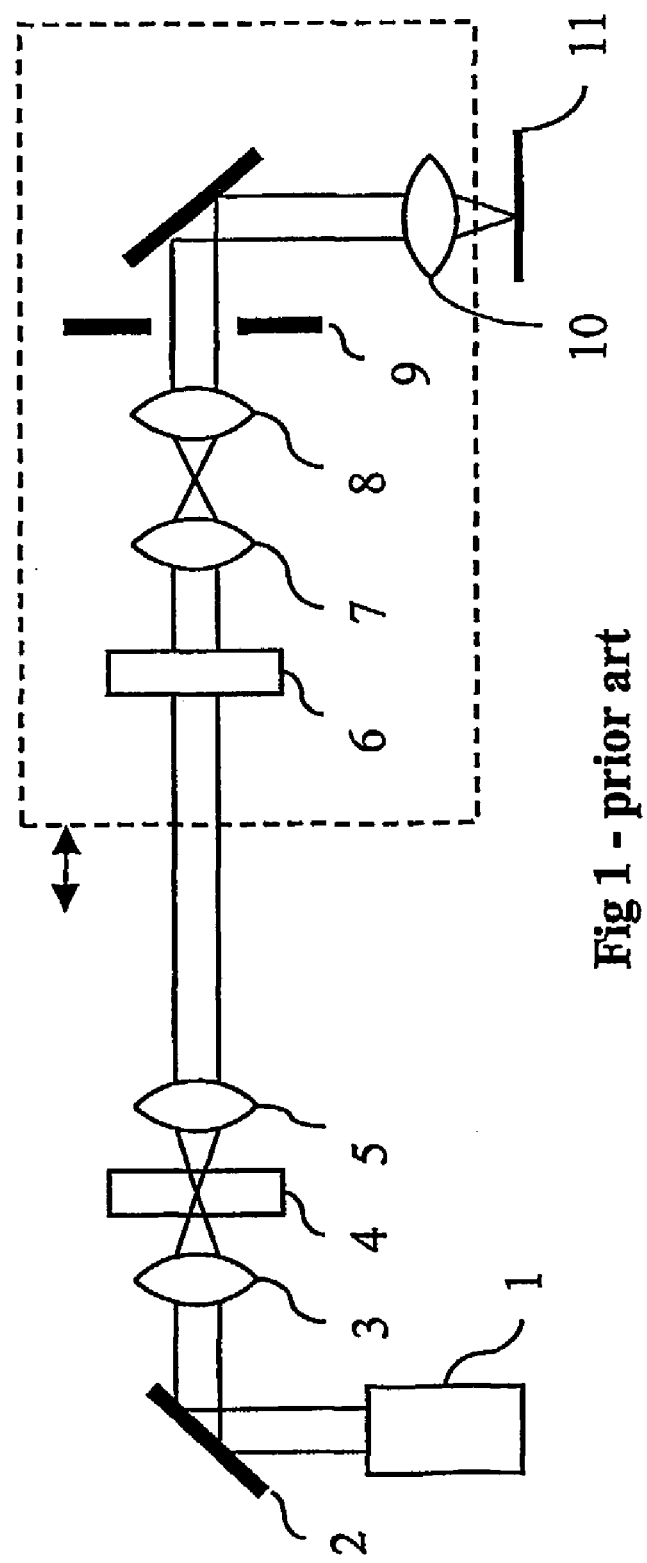
Fig 1 - prior art

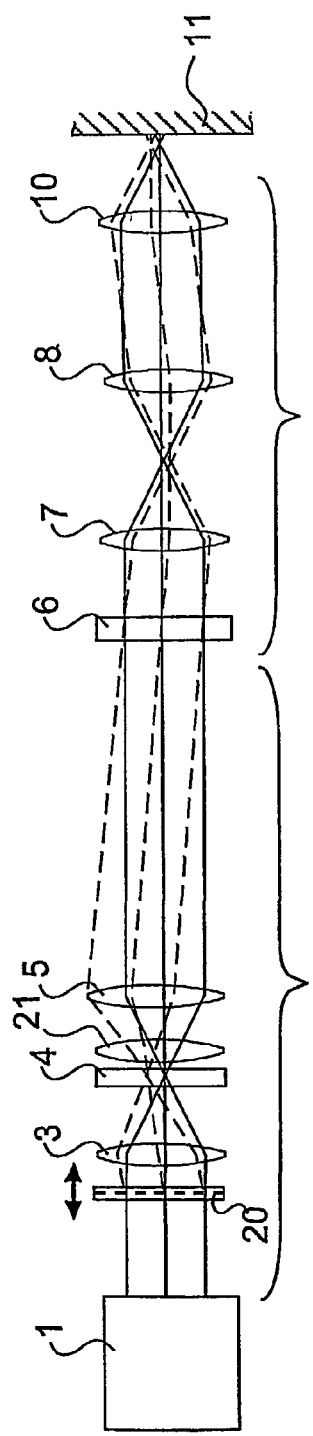
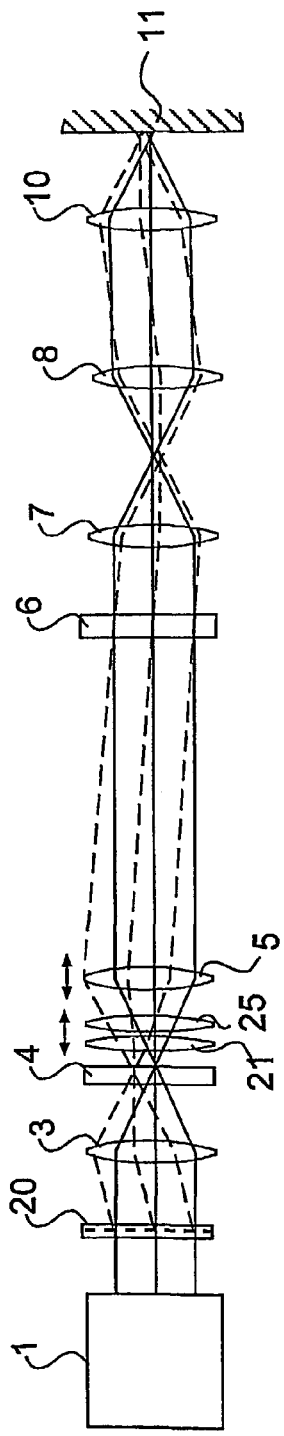
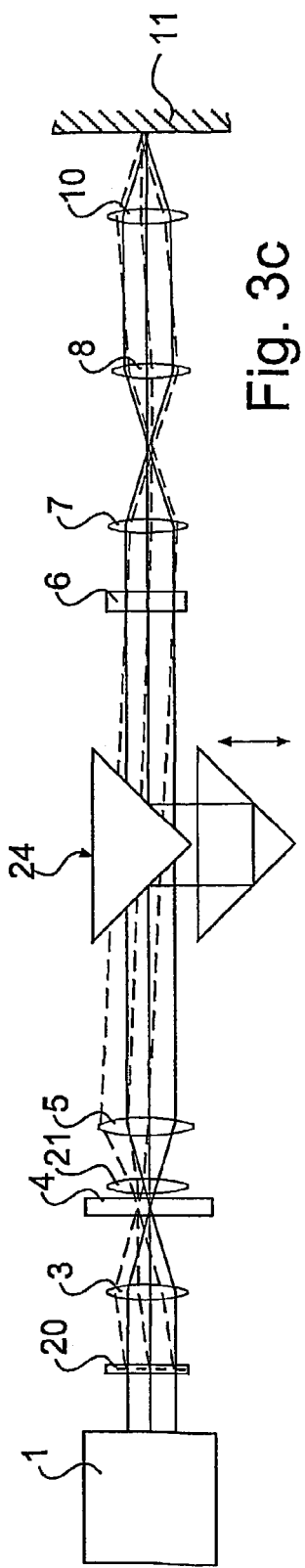

MULTI-BEAM PATTERN GENERATOR

This application is the national phase under 35 U.S.C. §371 of PCT International Application No. PCT/SE01/01443 which has an International filing date of Jun. 25, 2001, which designated the United States of America.

FIELD OF THE INVENTION

The present invention relates to a system and a method for microlithographic multi-beam writing on photosensitive substrates, and especially printing of patterns with extremely high precision, such as photomasks for semiconductor device patterns, display panels, integrated optical devices and electronic interconnect structures. The terms writing and printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared to extreme UV.

BACKGROUND OF THE INVENTION

A system and method for microlithographic writing of a substrate is previously known from e.g. EP 0 467 076 by the same applicant. An example of a system for microlithographic writing, as is shown in FIG. 1, comprises a light source 1, such as a laser, one or more reflecting mirrors 2 to direct the beam in the intended direction, a first lens 3 to contract the light beams, a modulator 4 to produce the desired pattern to be written, and a second lens 5 after the modulator. The modulator is controlled according to input data. A deflector is used to scan the beams on the substrate 11, and lenses 7, 8, 10 are used to contract and focus the beams on the substrate. The deflector could be a movable reflective element, such as a mirror. However, several functionally equivalent scanners such as acusto-optic deflectors etc. could also be used. Further, the substrate is preferably arranged on an object table.

A relative motion between the lens 10 and the table (stage) could be provided by arranging at least the objective lens 10, and preferably the lenses 7–8 and the deflector 6 as well, on a carrier. Hereby, the carrier could be moved relative to the substrate, and relative to the light source in a direction essentially perpendicular to the scanning direction.

If such a prior art system should be used with several beams concurrently being directed to the substrate, so called multi-beam writing, in order to improve the writing speed, several problems would arise.

It is important to obtain a gauss stationary illumination in the lens stop, but this proves difficult to obtain when using multi-beam in combination with a movable carrier. If such illumination is not obtained, beams will impinge on the substrate at different angles, whereby small differences in focus on the substrate, which is inevitable, will result in detrimental variations in the scanning lengths. For several applications, a maximum variation in scanning length of 20 nm is required. Therefore, a high degree of telecentricity, i.e. the beams being parallel during the scanning, is required. To obtain this it is important that the beams are superposed on each other in the deflector, but this proves to be difficult to obtain due to the varying distance between the deflector on the carrier and the modulator.

Specifically, using multi-beam writing in a pattern generator where part of the optical path is movable will cause problems. FIG. 2a illustrates a pattern generator where the movable optical path is in an intermediate position. In this case, the beams will coincide in the deflector 6, and a satisfying telecentricity will be obtained. However, when the carrier is moved to an end position, as is illustrated in FIG. 2b, the beams will not coincide in the deflector, but be displaced from each other. Hereby, the beam path in the objective lens 10 will be oblique, and the telecentricity will be severely deteriorated. There will also be a loss in radiation energy, since part of the beams will be displaced from the working part of the lenses.

SUMMARY OF THE INVENTION

It is therefore an object of the present invention to provide a system and a method for microlithographic multi-beam writing, whereby the related problems in the prior art are overcome or at least alleviated.

This object is achieved with a system according to the appended claims.

According to the invention a scanning pattern generator and a method are provided for microlithographic multi-beam writing of high precision patterns on a photosensitive substrate (11). The system comprises a light source (1), preferably a laser, for generating at least two light beams, a computer-controlled light modulator (4), a deflector for scanning the beams on the substrate and an objective lens (10) to contract the at least one light beam from the light source before it reaches the substrate, wherein at least the objective lens is arranged on a carrier (22) being movable relative to the substrate (11) and the light source (1), wherein the carrier defines a movable optical path relative to the remaining, stationary optical path. Further, it comprises means for altering the stationary optical path in order to maintain telecentricity for the beams as they impinge on the photosensitive substrate during the movement of the carrier and the movable optical path.

Hereby, the stationary optical path could automatically be adjusted in order to maintain the telecentricity.

Preferably, the deflector (6) is arranged on the carrier, wherein the means for altering the stationary optical path are arranged to make the beams coincide in the deflector.

According to a first aspect of the invention, the means for altering the stationary optical path comprises means (24) for altering the spatial path length of the stationary optical path, such as an optical detour (24) comprising movable reflecting elements.

According to a second aspect of the invention, the means for altering the stationary optical path comprises a controllable beam splitter (20). This beam splitter is preferably movable, and preferably comprises a diffractive optical element.

According to a third aspect of the invention, the means for altering the stationary optical path comprises at least one movable lens being arranged after the modulator.

BRIEF DESCRIPTION OF THE DRAWINGS

For exemplifying purposes, the invention will be described in closer detail in the following with reference to embodiments thereof illustrated in the attached drawings, wherein:

FIG. 1 is a schematic view of a prior art single-beam system;

FIG. 3a is a schematic view of a system according to a first embodiment of the invention;

FIG. 3b is a schematic view of a system according to a second embodiment of the invention; and FIG. 3c is a schematic view of a system according to a third embodiment-of the invention.

DESCRIPTION OF PREFERRED EMBODIMENTS

Figure 2A:
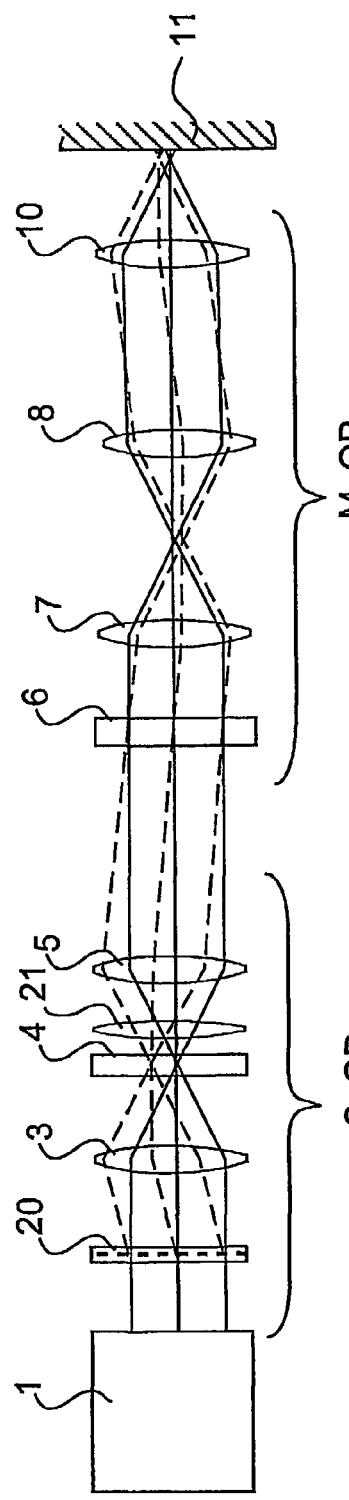
FIGS. 2a and 2b is a schematic view of a multi-beam system, illustrating the problem with deteriorated telecentricity.

The system according to the invention is preferably a laser scanner system, such as is known from EP 0 467 076, hereby introduced by reference, but with imporved properties for multi-beam writing. Hence, the system is a multi-beam system, where the system preferably comprises a beam splitter to divide the beam from the light source to several beams, exposing the substrate in several scan lines simultaneously.

Referring to FIG. 3a, the system according to a first, preferred embodiment of the invention comprises a light source 1, preferably a laser, a beam-splitter 20 to divide the beam from the light source into several beams, a computer-controlled light modulator 4 and an objective lens 10 to contract the light beam from the light source before it reaches the photosensitive substrate 11. Further, the system preferably comprises one or more reflecting mirrors 2 to direct the beam in the intended direction, a modulator 4 to produce the desired pattern to be written, a first lens 3 to contract the light beams on the modulator, and a second (collimator) lens 5 after the modulator to direct the beams towards a deflector 6. The modulator is controlled according to input data.

The deflector 6 is used to scan the beams on the substrate 11, and lenses 7, 8, 10 are used to contract and focus the beams on the substrate. Further, a lens stop 9 is preferably used to prevent stray-light from impinging on the substrate. The deflector could be a movable reflective element, such as a mirror. However, several functionally equivalent scanners such as acusto-optic deflectors etc. could also be used. Further, the substrate 11 is preferably arranged on an object table.

At least the objective lens 10 is placed on a movable carrier 22, but preferably the deflector 6, and the lenses 7–8 as well are arranged on the carrier as well. The carrier 22 is movable relative to the substrate and further, movable in the beam direction relative to the modulator and the other optical elements of the system. The system according to the invention is specifically useful for writing of large-area substrates, and for such applications the carrier could typically be moved 1100 mm during operation.

Due to the movement of the carrier, the beams travels at first through a stationary optical path, and thereafter on a movable optical path on the carrier, and is then directed to the substrate.

Figure 2B:
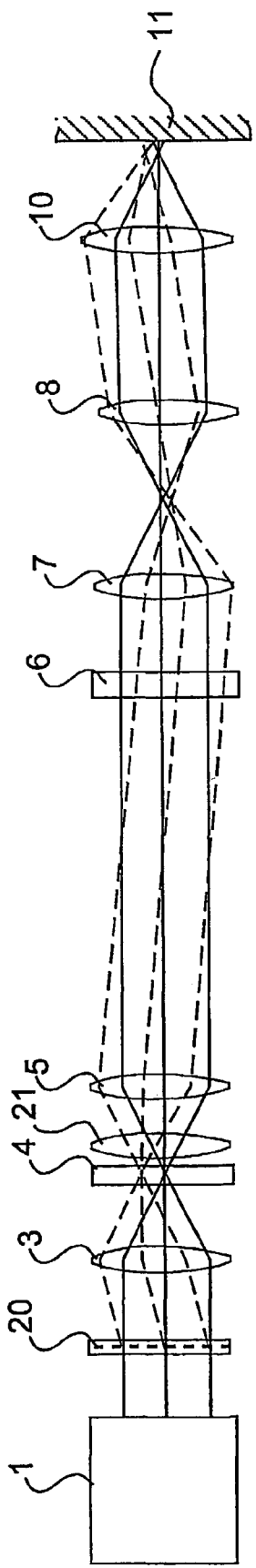

According to the invention, the system further comprises means for altering how the beams from the stationary optical path is directed to the movable optical path. This, means preferably comprises a movable diffractive optical element (DOE) or a controllable beam splitter, and most preferably a diffractive optical beam splitter 20, arranged ahead of the modulator 4. This optical element 20 is movable, whereby the direction of the beams being directed to the movable optical path and the deflector could be altered. Hereby, very limited movements of the optical element are required in order to achieve sufficient telecentricity, whereby only a low degree of mechanical precision is needed. For example, to compensate for movements of about 1100 mm of the carrier a movement of about +/−35 mm for the optical element is required. Hereby, by adjusting the position of the beam splitter or the diffractive optical element it is possible to make the beams coincide in the deflector, and thereby see to that a satisfactory telecentricity is obtained. This is illustrated in FIG. 3a, where the position of the carrier is the same as in FIG. 2b, but where the beam splitter 20 has been moved to compensate this.

The control of the movement of the optical element is preferably controlled synchronized and in relation to the movement of the carrier 22. To this end, a controller is preferably provided. Said controller is supplied with a position signal indicating the position of the carrier, and accordingly generates a control signal to the optical element.

In FIG. 3b, an alternative second embodiment of the invention according to the invention is shown. In this embodiment the same reference numerals are used to indicate similar components. The system according to the second embodiment corresponds to the first embodiment described hereinbefore, but with the difference that the means for altering how the beams from the stationary optical path is directed to the movable optical path, and to the deflector, is here one or several movable lenses arranged after the modulator. These movable lenses are preferably the collimator lenses 5 and 21. Further, movable or stationary lenses, such as lens 25, may be arranged as well. Hence, in this embodiment, one, two or even more movable collimator lenses are used to control the beams to make them coincide in the deflector and to improve the telecentricity.

In FIG. 3c, an alternative third embodiment of the invention according to the invention is shown. In this embodiment the same reference numerals are used to indicate similar components. The system according to the second embodiment corresponds to the first embodiment described hereinbefore, but with the difference that the means for altering how the beams from the stationary optical path is directed to the movable optical path, and to the deflector, is here means 24 for altering the optical path length between the modulator and the deflector. Such means could e.g. comprise an optical detour with reflecting elements such as mirrors or prisms, where at least one of the reflecting elements are movable to increase or decrease the spatial path length, as is illustrated in FIG. 3c.

Hence, in this third embodiment, the optical path length is altered to control the beams to make them coincide in the deflector and to improve the telecentricity.

The system according to the invention provides enhanced precision and telecentricity in an easy way and by means of few components. Hence, the system and method according to the invention efficiently compensates for beam position variations due to deteriorated telecentricity. Thus, the invention makes microlithographic writing of high precision patterns more efficient and cost effective, at the same time as the pattern precision is improved.

However several variations of the above-mentioned embodiments are possible, and obvious for a person skilled in the art. For example, several different means for altering the optical path length are possible to use, such as optical detours, different controllable beam splitters, different optical elements and the like. Such obvious modifications must be considered as being part of the invention, as it is defined by the following claims.

What is claimed is:

1. A scanning pattern generator comprising:
   a light source for generating at least two light beams;
   a computer-controlled light modulator;

a deflector for scanning the beams on a photosensitive substrate;

an objective lens to contract the at least one light beam from the light source before the at least one light beam reaches the photosensitive substrate; and means for altering the stationary optical path in order to maintain telecentricity for the beams as they impinge on the photosensitive substrate during the movement of the carrier and a movable optical path; wherein at least the objective lens is arranged on a carrier, being movable relative to the substrate and the light source, wherein the carrier defines the movable optical path relative to the remaining stationary optical path.

2. The system according to claim 1, wherein the means for altering the stationary optical path is automatically controlled in relation to the movement of the carrier.

3. The system according to claim 2, further including a controller supplied with a position signal indicating the position of the carrier and generating a control signal to control the means for altering the stationary optical path.

4. The system according to claim 1, wherein the deflector is arranged on the carrier, and the means for altering the stationary optical path are arranged to make the beams coincide in the deflector.

5. The system according to claim 1, wherein the means for altering the stationary optical path comprises means for altering a spatial path length of the stationary optical path.

6. The system according to claim 5, wherein the means for altering the stationary optical path comprises an optical detour comprising movable reflecting elements.

7. The system according to claim 1, wherein the means for altering the stationary optical path comprises a controllable beam sputter.

8. The system according to claim 7, wherein the beam sputter is a diffractive optical element.

9. The system according to claim 1, wherein the means for altering the stationary optical path comprises at least one movable lens being arranged after the modulator.

10. The system according to claim 1, wherein the modulator is an acousto-optic modulator.

11. The system according to claim 1, wherein the deflector is an acousto-optic deflector.

12. The scanning pattern generator of claim 1, wherein the light source is a laser.

13. A method for scanning microlithographic multibeam writing of high precision patterns on a photosensitive substrate with at least two light beams emitted from a light source and controlled by a computer-controlled light modulator, a deflector for scanning the beams on the substrate and an objective lens to contract the at least one light beam from the light source before it reaches the substrate, wherein at least the objective lens is arranged on a carrier being movable relative to the substrate and the light source, wherein the carrier defines a movable optical path relative to a remaining stationary optical path, the method comprising:

altering the stationary optical path in order to maintain telecentricity for the beams as they impinge on the photosensitive substrate during the movement of the carrier and the movable optical path.

14. The method according to claim 13, wherein the altering of the stationary optical path is automatically controlled in relation to the movement of the carrier.

15. The method according to claim 13, wherein the deflector is arranged on the carrier, and the altering of the stationary optical path makes the beams coincide in the deflector.

16. The method according to claim 13, wherein the altering of a stationary optical path comprises altering the spatial path length of the stationary optical path.

17. The method according to claim 13, wherein altering of the stationary optical path comprises controlled movement of a movable beam splitter.

18. The method according to claim 13, wherein altering of the stationary optical path includes controlled movement of at least one lens being arranged after the modulator.

19. A scanning pattern generator comprising:

a light source adapted to generate at least two light beams;

a computer-controlled light modulator;

a deflector adapted to scan the beams on the substrate;

an objective lens to contract at least one light beam from the light source before the at least one light beam reaches the substrate; and optics adapted to alter a stationary optical path such that the beams are telecentric as they impinge on the substrate during the movement of the carrier and a movable optical path; wherein at least the objective lens is arranged on a carrier, movable relative to the substrate and the light source, and the carrier defines the movable optical path relative to the stationary optical path.

20. The scanning pattern generator of claim 19, wherein the optics include at least one of a movable diffractive optical element and a controllable beam splitter.

21. The scanning pattern generator of claim 19, wherein the optics include at least one collimator lens.

22. The scanning pattern generator of claim 19, wherein the optics include at least one reflecting element.

23. The scanning pattern generator of claim 19, wherein the optics include at least one of a mirror and a prism.

24. The scanning pattern generator of claim 19, wherein the light source is a laser.

25. A method for scanning microlithographic multibeam writing of high precision patterns on a substrate, the method comprising:

emitting at least two light beams from a light source and controlling the at least two light beams via a computer-controlled light modulator;

contracting at least one light beam before it reaches the substrate;

scanning the at least two light beams on the substrate;

moving a movable optical path of the at least two light beams relative to a remaining stationary optical path; and altering the stationary optical path such that the at least two beams are telecentric as they impinge on the substrate during the movement of a carrier and the movable optical path.

* * * * *